(12) United States Patent
Won et al.

(10) Patent No.: US 10,741,788 B2
(45) Date of Patent: Aug. 11, 2020

(54) DISPLAY DEVICE

(71) Applicant: LG Display Co., Ltd., Seoul (KR)

(72) Inventors: Sang-Hyuk Won, Gimpo-si (KR); Min-Joo Kim, Seoul (KR); Jae-Won Lee, Goyang-si (KR); Sang-Hoon Pak, Seoul (KR); Jae-Hyung Jang, Paju-si (KR); Yeon-Woo Shin, Seoul (KR); Ji-Hun Lee, Anseong-si (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 16/701,977

(22) Filed: Dec. 3, 2019

(65) Prior Publication Data

US 2020/0194714 A1    Jun. 18, 2020

(30) Foreign Application Priority Data

Dec. 14, 2018  (KR) .................. 10-2018-0161821

(51) Int. Cl.
*H01L 51/00* (2006.01)
*H01L 51/52* (2006.01)
*H01L 27/32* (2006.01)

(52) U.S. Cl.
CPC ...... *H01L 51/5237* (2013.01); *H01L 27/3225* (2013.01); *H01L 27/3248* (2013.01); *H01L 2251/301* (2013.01)

(58) Field of Classification Search
CPC ............. H01L 51/5056; H01L 51/5012; H01L 51/0072; H01L 51/5072; H01L 51/0067; H01L 51/56; H01L 51/5016; H01L 51/0097; H01L 51/5253; H01L 51/50; H01L 51/5088; H01L 27/3276; H01L 51/0074; H01L 2251/5338; H01L 27/3258; H01L 51/0073; H01L 27/3246; H01L 51/5092; H01L 2227/323; H01L 51/0035; H01L 51/0085; H01L 27/326; H01L 27/3262; H01L 51/5096; H01L 51/5221; H01L 27/32; H01L 27/3244; H01L 51/5206; H01L 2251/566; H01L 27/3248; H01L 51/00; H01L 51/0058; H01L 51/5004; C09K 11/06; C09K 2211/1018; C09K 11/02; C09K 2211/1007; C09K 2211/1029; C09K 2211/185; C09K 11/025; C09K 2211/1014; C09K 2211/1088; C08G 61/12; C08G 2261/512; C08G 2261/95; C08G 2261/3162; C08G 61/124; C08G 2261/312; C08G 2261/3241

See application file for complete search history.

(56) References Cited

U.S. PATENT DOCUMENTS

2013/0207087 A1*  8/2013  Kim .................. H01L 29/78633
                                                       257/40

* cited by examiner

*Primary Examiner* — Robert G Bachner
(74) *Attorney, Agent, or Firm* — Seed IP Law Group LLP

(57) ABSTRACT

Disclosed is a display device having a reduced non-display area. The display device includes an organic cover layer disposed on an encapsulation unit, an inner dam disposed between a substrate hole and a plurality of light-emitting elements, and a blocking element disposed between the substrate hole and the inner dam, the blocking element being disposed under the organic cover layer, whereby it is possible to prevent damage to a light-emitting stack. In addition, since the substrate hole is disposed in an active area, it is possible to reduce the size of a non-display area.

20 Claims, 15 Drawing Sheets

DISPLAY DEVICE

CROSS-REFERENCE TO RELATED APPLICATION(S)

This application claims the benefit of Korean Patent Application No. 10-2018-0161821, filed on Dec. 14, 2018, which is hereby incorporated by reference as if fully set forth herein.

BACKGROUND

Technical Field

The present disclosure relates to a display device, and more particularly to a display device having a reduced non-display area.

Description of the Related Art

Image display devices, which are a core technology in the information and communication age and serve to display various kinds of information on a screen, have been developed such that the image display devices are thinner, lighter, and portable and exhibit high performance. As a result, flat panel display devices, which have lower weight and volume than cathode ray tubes (CRT), have received a great deal of attention.

Representative examples of such flat panel display devices may include a liquid crystal display (LCD) device, a plasma display panel (PDP) device, an organic light-emitting display (OLED) device, and an electrophoretic display (ED) device.

BRIEF SUMMARY

A flat panel display device is used in various kinds of equipment, such as a TV, a monitor, and a cellular phone, and in addition, a camera, a speaker, and a sensor are mounted in the flat panel display device. The camera, the speaker, and the sensor are disposed in a non-display area of the display device. In a display device, therefore, the size of a non-display area, i.e., a bezel area or a pad area, is increased, whereby the size of a display area i.e., an active area of the display device is reduced.

Accordingly, the present disclosure is directed to a display device that substantially obviates one or more problems due to limitations and disadvantages of the related art.

The present disclosure provides a display device having a reduced non-display area.

Additional advantages, objects, and features of the disclosure will be set forth in part in the description which follows and in part will become apparent to those having ordinary skill in the art upon examination of the following or may be learned from practice of the disclosure. The objectives and other advantages of the disclosure may be realized and attained by the structure particularly pointed out in the written description and claims hereof as well as the appended drawings.

To achieve these objects and other advantages and in accordance with the purpose of the disclosure, as embodied and broadly described herein, a display device includes an organic cover layer disposed on an encapsulation unit, a inner dam disposed between a substrate hole and a plurality of light-emitting elements, and a blocking element disposed between the substrate hole and the inner dam, the blocking element being disposed under the organic cover layer, whereby it is possible to prevent damage to a light-emitting stack, and it is possible to reduce the size of a non-display area since the substrate hole is disposed in an active area.

It is to be understood that both the foregoing general description and the following detailed description of the present disclosure are exemplary and explanatory and are intended to provide further explanation of the disclosure as claimed.

BRIEF DESCRIPTION OF THE SEVERAL VIEWS OF THE DRAWINGS

The accompanying drawings, which are included to provide a further understanding of the disclosure and are incorporated in and constitute a part of this application, illustrate embodiment(s) of the disclosure and together with the description serve to explain the principle of the disclosure. In the drawings.

DETAILED DESCRIPTION

Reference will now be made in detail to one or more embodiments of the present disclosure, examples of which are illustrated in the accompanying drawings. Wherever possible, the same reference numbers will be used throughout the drawings to refer to the same or like parts.

Figure 1:
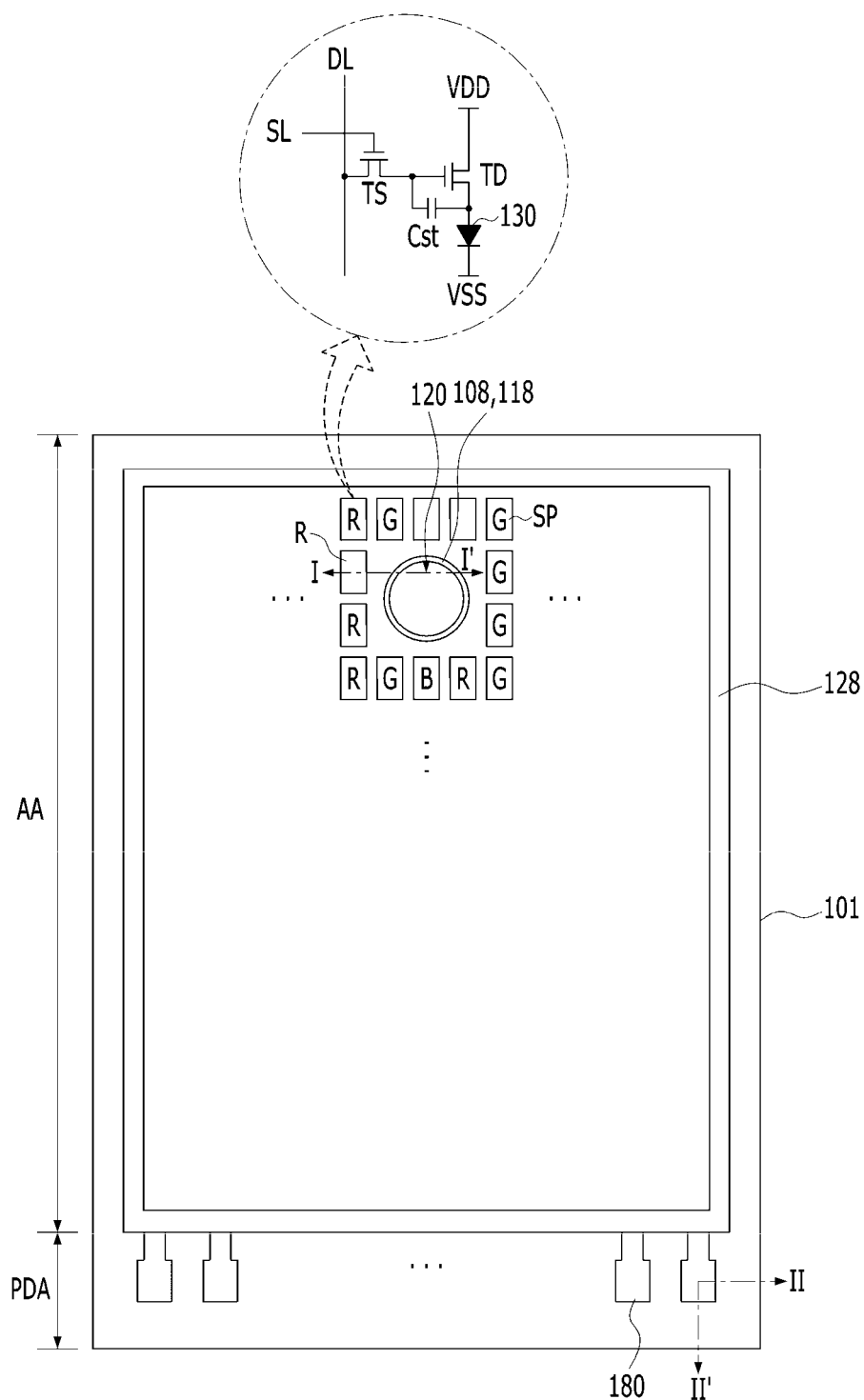
FIG. 1 is a view showing an organic light-emitting display device having a substrate hole according to the present disclosure.
Figure 2:
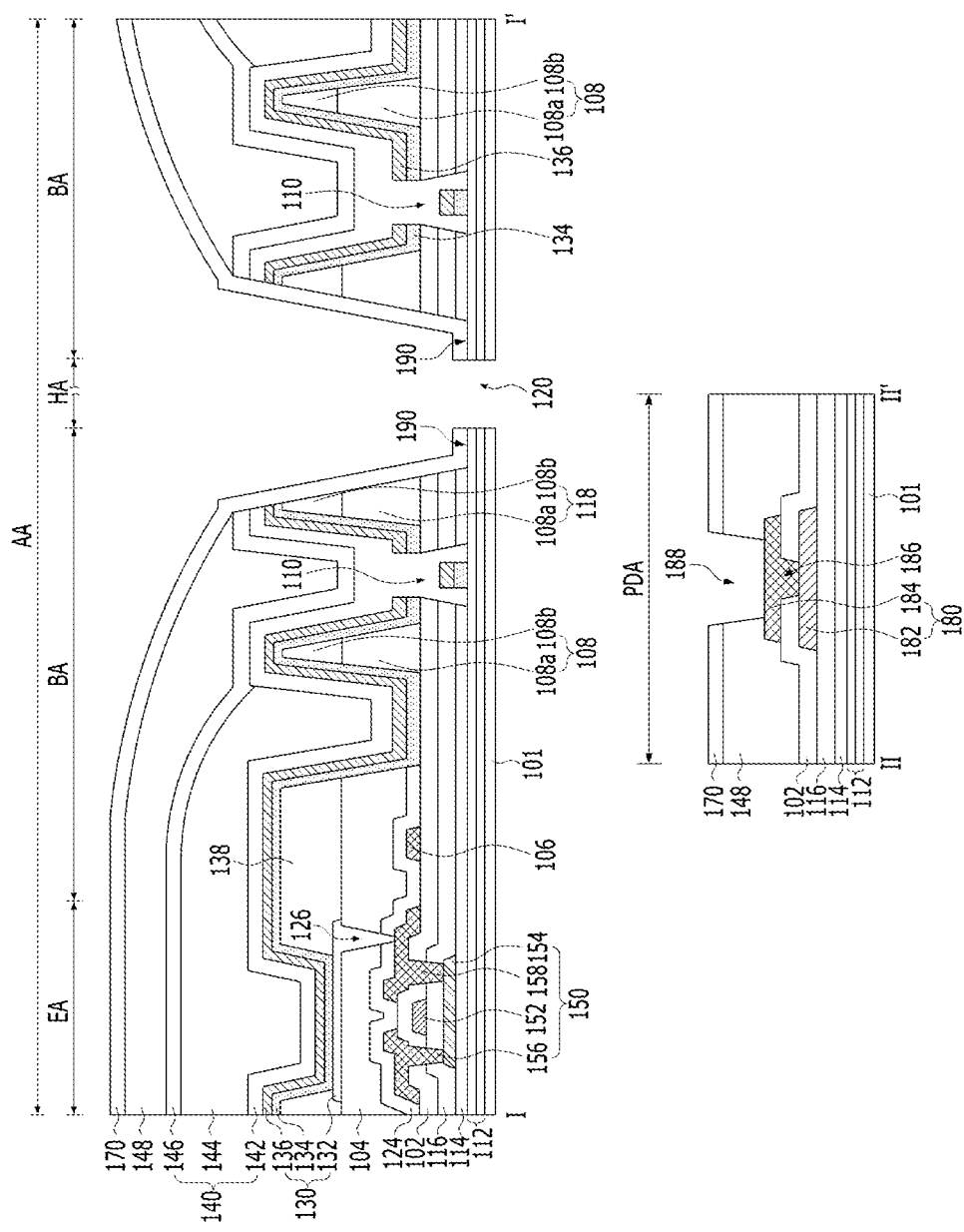
FIG. 2 is a sectional view of the organic light-emitting display device taken along lines I-I' and II-II' of FIG. 1.

The display device shown in FIGS. 1 and 2 includes an active area AA and a pad area PDA.

A plurality of pads 180 for supplying driving signals to a plurality of signal lines 106, disposed in the active area AA, is formed in the pad area PDA. Here, the signal lines 106 include at least one of a scan line SL, a data line DL, a high-voltage (VDD) supply line, or a low-voltage (VSS) supply line. Each of the plurality of pads 180 includes at least one of a pad lower electrode 182 or a pad upper electrode 184. At least one of the pad lower electrode 182 or the pad upper electrode 184 contacts a corresponding one of the signal lines 106.

The pad lower electrode 182 is made of the same material as a gate electrode 152, and is disposed on a gate dielectric film 116, which is disposed in the same plane as the gate electrode 152. The pad upper electrode 184 is made of the same material as source and drain electrodes 156 and 158, and is disposed on an interlayer dielectric film 102, which is disposed in the same plane as the source and drain electrodes 156 and 158. The pad upper electrode 184 contacts the pad lower electrode 182, which is exposed through a first pad contact hole 186 formed through the interlayer dielectric film 102. The pad upper electrode 184 is exposed through a second pad contact hole 188 formed through an organic cover layer 148 and an inorganic cover layer 170, and is electrically connected to a signal transmission film (not shown) connected to a driving integrated circuit (not shown).

Meanwhile, although the structure in which the pad lower electrode 182 and the pad upper electrode 184 contact each other via the first pad contact hole 186 has been described by way of example with reference to FIG. 2, the pad lower electrode 182 and the pad upper electrode 184 may not contact each other but may be opposite each other with the interlayer dielectric film 102 disposed between the pad lower electrode 182 and the pad upper electrode 184.

The active area AA includes an emission area EA, a barrier area BA, and a hole area HA.

Unit pixels, each of which includes a light-emitting element 130, are disposed in the emission area EA. As shown in FIG. 1, each of the unit pixels includes red (R), green (G), and blue (B) subpixels, or includes red (R), green (G), blue (B), and white (W) subpixels. Each of the subpixels includes a light-emitting element 130 and a pixel-driving circuit for independently driving the light-emitting element 130.

The pixel-driving circuit includes a switching transistor TS, a driving transistor TD, and a storage capacitor Cst.

When a scan pulse is supplied to the scan line SL, the switching transistor TS is turned on to supply a data signal, which is supplied to the data line DL, to the storage capacitor Cst and to a gate electrode of the driving transistor TD.

In response to the data signal supplied to the gate electrode of the driving transistor TD, the driving transistor TD controls current I that is supplied from the high-voltage (VDD) supply line to the light-emitting element 130 to adjust the amount of light emitted by the light-emitting element 130. Even when the switching transistor TS is turned off, the driving transistor TD supplies uniform current I to the light-emitting element 130 using the voltage charged in the storage capacitor Cst such that the light-emitting element 130 keeps emitting light until a data signal of the next frame is supplied.

As shown in FIG. 2, the driving transistor TD 150 includes an active layer 154 disposed on an active buffer layer 114, a gate electrode 152 overlapping the active layer 154 with the gate dielectric film 116 disposed between the active layer 154 and the gate electrode 152, and source and drain electrodes 156 and 158 formed on the interlayer dielectric film 102 so as to contact the active layer 154.

The active layer 154 is made of at least one of an amorphous semiconductor material, a polycrystalline semiconductor material, or an oxide semiconductor material. The active layer 154 includes a channel area, a source area, and a drain area. The channel area overlaps the gate electrode 152 with the gate dielectric film 116 disposed between the channel area and the gate electrode 152 so as to be formed between the source and drain electrodes 156 and 158. The source area is electrically connected to the source electrode 156 via a source contact hole, which is formed through the gate dielectric film 116 and the interlayer dielectric film 102. The drain area is electrically connected to the drain electrode 158 via a drain contact hole, which is formed through the gate dielectric film 116 and the interlayer dielectric film 102. A multi-layered buffer layer 112 and an active buffer layer 114 are provided between the active layer 154 and a substrate 101. The multi-layered buffer layer 112 retards the diffusion of moisture and/or oxygen permeated into the substrate 101. The multi-layered buffer layer 112 may be formed over the entire substrate 101 in order to provide an environment in which it is possible to more stably form a thin film while enabling various processes to be more smoothly performed before a full-scale process of manufacturing the display panel is performed. The active buffer layer 114 protects the active layer 154 and blocks the introduction of various defects from the substrate 101. At least one of the multi-layered buffer layer 112, the active buffer layer 114, or the substrate 101 has a multi-layered structure.

At this time, the uppermost layer of the multi-layered buffer layer 112, which contacts the active buffer layer 114, is made of a material having etching properties different from the etching properties of the other layers of the multi-layered buffer layer 112, the active buffer layer 114, and the gate dielectric film 116. The uppermost layer of the multi-layered buffer layer 112, which contacts the active buffer layer 114, is made of one of SiNx and SiOx, and the other layers of the multi-layered buffer layer 112, the active buffer layer 114, and the gate dielectric film 116 are made of the other of SiNx and SiOx. For example, the uppermost layer of the multi-layered buffer layer 112, which contacts the active buffer layer 114, is made of SiNx, and the other layers of the multi-layered buffer layer 112, the active buffer layer 114, and the gate dielectric film 116 are made of SiOx.

The light-emitting element 130 includes an anode electrode 132 connected to the drain electrode 158 of the driving transistor 150, at least one light-emitting stack 134 formed on the anode electrode 132, and a cathode electrode 136 formed on the light-emitting stack 134 so as to be connected to the low-voltage (VSS) supply line. Here, the low-voltage (VSS) supply line supplies a low voltage VSS, which is lower than a high voltage VDD.

The anode electrode 132 is electrically connected to the drain electrode 158 of the driving transistor 150, which is exposed through a pixel contact hole 126 formed through a passivation film 124 and a planarization layer 104 disposed on the driving transistor 150. The anode electrode 132 of each subpixel is formed on the planarization layer 104 so as to be exposed by a bank 138.

In the case in which the anode electrode 132 is applied to a rear light-emitting type organic light-emitting display device, the anode electrode 132 is made of a transparent conductive film, such as indium-tin-oxide (ITO) or indium-zinc-oxide (IZO). In the case in which the anode electrode 132 is applied to a front light-emitting type organic light-emitting display device, the anode electrode 132 is formed so as to have a multi-layered structure including a transparent conductive film and an opaque conductive film having high reflection efficiency. A material having a relatively high work function value, such as indium-tin-oxide (ITO) or indium-zinc-oxide (IZO), is used as the transparent conductive film, and a single- or multi-layered structure including Al, Ag, Cu, Pb, Mo, Ti, or an alloy thereof is used as the opaque conductive film. For example, the anode electrode 132 is formed so as to have a structure in which a transparent conductive film, an opaque conductive film, and a transparent conductive film are sequentially stacked.

The light-emitting stack 134 is formed by stacking a hole transport layer, a light-emitting layer, and an electron transport layer on the anode electrode 132 in that order or in the reverse order.

The cathode electrode 136 is formed on the light-emitting stack 134 and on the upper surface and the side surface of the bank 138 so as to be opposite the anode electrode 132 with the light-emitting stack 134 disposed between the cathode electrode 136 and the anode electrode 132.

The encapsulation unit 140 prevents external moisture or oxygen from permeating into the light-emitting element 130, which has low resistance to external moisture or oxygen. To this end, the encapsulation unit 140 includes a plurality of inorganic encapsulation layers 142 and 146 and an organic encapsulation layer 144 disposed between the inorganic encapsulation layers 142 and 146. The inorganic encapsulation layer 146 is disposed at the uppermost layer. At this time, the encapsulation unit 140 includes at least one inorganic encapsulation layer 142 and 146 and at least one organic encapsulation layer 144. In the present disclosure, an encapsulation unit 140 having a structure in which an organic encapsulation layer 144 is disposed between first and second inorganic encapsulation layers 142 and 146 will be described by way of example. A touch electrode is disposed between the encapsulation unit and the organic cover layer.

The first inorganic encapsulation layer 142 is formed on the substrate 101, on which the cathode electrode 136 is formed, so as to be closest to the light-emitting element 130. The first inorganic encapsulation layer 142 is made of an inorganic dielectric material that can be deposited at a low temperature, such as silicon nitride ($SiN_x$), silicon oxide ($SiO_x$), silicon oxide nitride (SiON), or aluminum oxide ($Al_2O_3$). Consequently, the first inorganic encapsulation layer 142 is deposited in a low-temperature atmosphere, whereby it is possible to prevent damage to the light-emitting stack 134, which has low resistance to a high-temperature atmosphere, when the first inorganic encapsulation layer 142 is deposited.

The second inorganic encapsulation layer 146 is formed so as to cover the upper surface and the side surface of the organic encapsulation layer 144 and the upper surface and the side surface of the first inorganic encapsulation layer 142, which is exposed by the organic encapsulation layer 144. Consequently, the upper surface, the lower surface, and the side surface of the organic encapsulation layer 144 are sealed by the first and second inorganic encapsulation layers 142 and 146, whereby it is possible to minimize (or reduce) or prevent external moisture or oxygen from permeating into the organic encapsulation layer 144 or to minimize (or reduce) or prevent moisture or oxygen present in the organic encapsulation layer 144 from permeating into the light-emitting element 130. The second inorganic encapsulation layer 146 is made of an inorganic dielectric material, such as silicon nitride ($SiN_x$), silicon oxide ($SiO_x$), silicon oxide nitride (SiON), or aluminum oxide ($Al_2O_3$).

The organic encapsulation layer 144 reduces stress between the layers due to bending of the organic light-emitting device and improves planarization. In addition, the organic encapsulation layer 144 is formed so as to have a larger thickness than the inorganic encapsulation layers 142 and 146 in order to prevent cracks or pinholes from being formed due to foreign matter. The organic encapsulation layer 144 is made of an organic dielectric material, such as an acrylic resin, an epoxy resin, polyimide, polyethylene, or silicon oxycarbide (SiOC).

An outer dam 128 and a inner dam 108 are formed to limit the mobility of the organic encapsulation layer 144 when the organic encapsulation layer 144 is formed.

As shown in FIG. 1, at least one outer dam 128 may be formed so as to completely surround the active area AA, in which the light-emitting element 130 is disposed, or may be formed only between the active area AA and the pad area PDA. In the case in which the pad area PDA, in which the pads 180 are disposed, is disposed at one side of the substrate 101, the outer dam 128 is disposed only at one side of the substrate 101. In the case in which the pad area PDA, in which the pads 180 are disposed, is disposed at opposite sides of the substrate 101, the outer dam 128 is disposed at the opposite sides of the substrate 101. In the case in which a plurality of outer dams 128 is disposed, the outer dams 128 are disposed side by side in the state of being spaced apart from each other by a predetermined distance. It is possible to prevent the organic encapsulation layer 144 from spreading to the pad area PDA by the provision of the outer dam 128.

In the same manner as the outer dam 128, at least one inner dam 108 is formed so as to have a single-layered or multi-layered structure 108a and 108b. For example, each of the inner dam 108 and the outer dam 128 is made of the same material as at least one of the planarization layer 104, the bank 138, or a spacer (not shown), and is formed simultaneously when the same is formed, whereby no additional mask process is required, and therefore it is possible to prevent an increase in costs. Furthermore, the blocking element can be made of a different material as the inner dam. The inner dam 108 is disposed to completely surround a blocking recess 110. The inorganic encapsulation layers 142 and 146 overlap the blocking recess 110. It is possible to prevent the organic encapsulation layer 144, which may be used as a moisture permeation path, from spreading to the blocking recess 110 by the provision of the inner dam 108.

The barrier area BA is disposed between the hole area HA and the emission area EA. The inner dam 108, a blocking element 118, at least one blocking recess 110, and a through-hole 190 are disposed in the barrier area BA.

Figure 3:
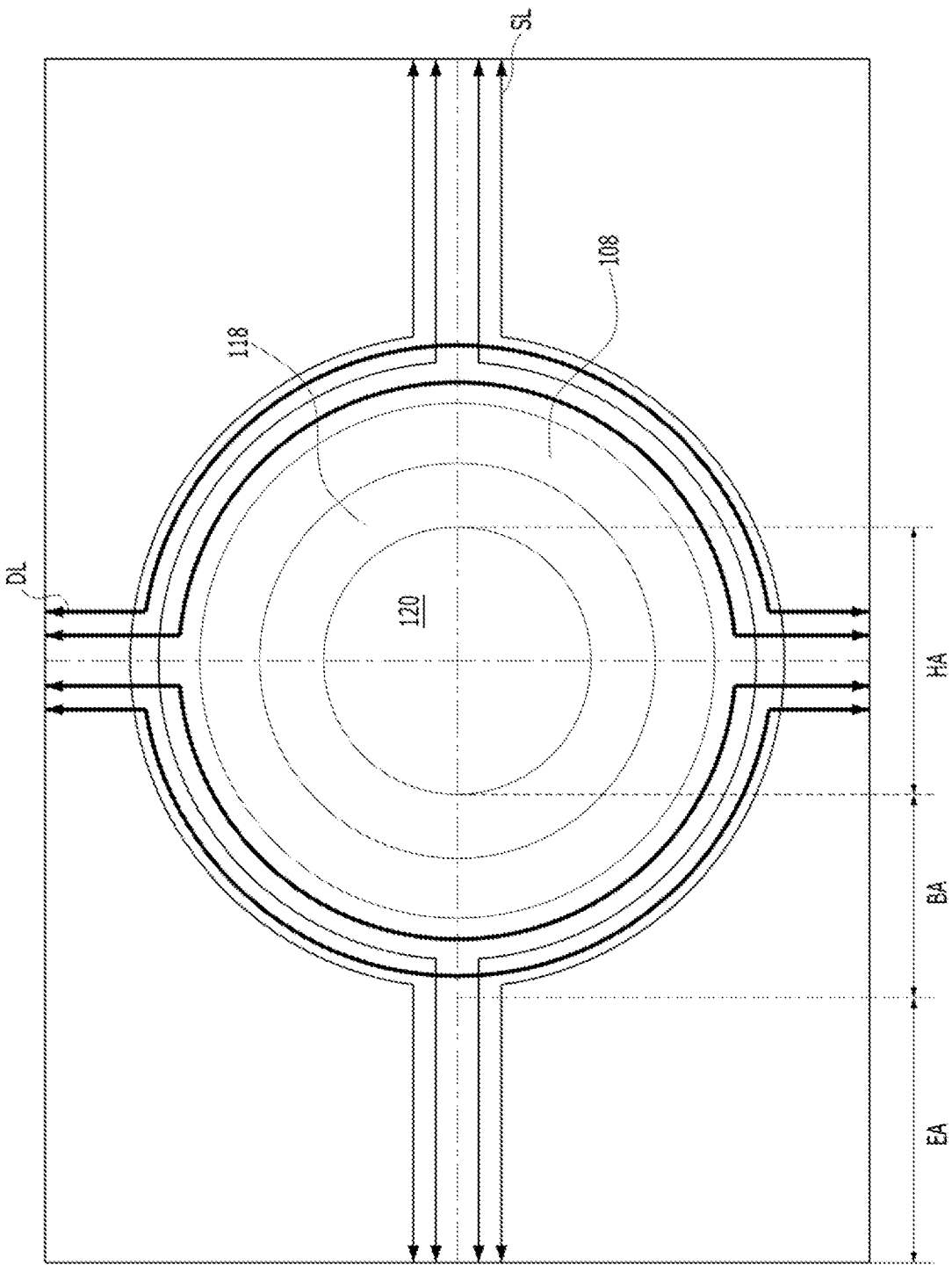
FIG. 3 is a detailed plan view showing the substrate hole area shown in FIG. 1.

As shown in FIG. 3, the blocking element 118 is disposed between the inner dam 108 and a substrate hole 120, which is disposed in the hole area HA, so as to completely surround (or to completely laterally surround) the substrate hole 120. At this time, the signal lines 106, including the scan line SL and the data line DL, which are disposed around the inner dams 108 and 118 and the substrate hole 120, are disposed so as to be diverted along the contour of the substrate hole 120.

The blocking element 118 is formed in the same plane as the inner dam 108, and is made of the same material as the inner dam 108. For example, the blocking element 118 is formed on the interlayer dielectric film 102 so as to have a multi-layered structure 108a and 108b, in the same manner as the inner dam 108. The lower layer 108a of the blocking element 118 is made of the same material as the planarization layer 104, and the upper layer 108b of the blocking element 118 is made of the same material as the bank 138. Since a portion of the blocking element 118 may be removed when the through-hole 190 is formed, the blocking element 118 is formed so as to have a width smaller than or equal to the width of the inner dam 108. Since the blocking element 118 is disposed so as to completely surround (or to completely laterally surround) the substrate hole 120, it is possible to prevent the organic cover layer 148, which may be used as a moisture permeation path, from spreading to the substrate hole 120. Furthermore, the blocking element 118 is disposed between the organic cover layer 148 in the barrier area BA (shown in left in FIG. 2) and organic cover layer 148 in the barrier area BA (shown in right in FIG. 2).

The blocking recess 110 is disposed between the inner dam 108 and the substrate hole 120, optionally between the inner dam 108 and the blocking element 118. The blocking recess 110 is formed through at least one of the multi-layered buffer layer 112, the active buffer layer 114, the gate dielectric film 116, or the interlayer dielectric film 102, which are disposed between the substrate 101 and the planarization layer 104. At this time, the side surface of the inorganic dielectric layer 112, 114, 116, or 102 exposed by the blocking recess 110 is formed in a reverse tapered shape so as to form an acute angle or a right angle with the bottom surface of the inorganic dielectric layer 112, 114, 116, or 102 exposed by the blocking recess 110. When the light-emitting stack 134 and the cathode electrode 136 are formed, the light-emitting stack 134 and the cathode electrode 136 are disconnected by the blocking recess 110. Even when external moisture permeates along the light-emitting stack 134 disposed around the hole area HA, therefore, the moisture may be prevented or impeded from being introduced into the emission area EA by the blocking recess 110. Also, even when static electricity is introduced along the cathode electrode 136 disposed around the hole area HA, the static electricity may be prevented from spreading to the emission area EA by the blocking recess 110. Furthermore, since the inorganic dielectric layers 112, 114, 116, and 102, each of which has higher hardness than an organic dielectric material and in which cracks are therefore easily formed by bending stress, are removed by the blocking recess 110, it is possible to prevent cracks from spreading to the emission area EA.

The organic cover layer 148 may be formed in the other areas EA, BA, and PDA, excluding the hole area HA, or may be formed only in the barrier area BA and the pad area PDA. That is, the organic cover layer 148 is formed so as to be prevented from spreading to the hole area HA by the blocking element 118. The organic cover layer 148 is formed on the uppermost inorganic encapsulation layer 146 of the encapsulation unit 140, and is made of the same material as the organic encapsulation layer 144. Consequently, the organic cover layer 148 is formed only through an application process without a separate photomasking process, whereby no separate stripping process is required.

Since the organic cover layer 148 does not contact the light-emitting stack 134 due to the presence of the second inorganic encapsulation layer 146, it is possible to prevent moisture from permeating into the light-emitting stack 134 through the organic cover layer 148. In addition, since the organic cover layer 148 is disposed on the encapsulation unit 140, it is possible to prevent the inorganic encapsulation layers 142 and 146, which are disposed in the emission area EA, from being etched when the through-hole 190 is formed.

The inorganic cover layer 170 is formed on the organic cover layer 148, and is made of an inorganic dielectric material. Since the interfaces between the organic cover layer 148 and the thin films 114, 116, 102, 118, 134, 136, 142 and 146, which are exposed by the through-hole 190, are sealed by the inorganic cover layer 170, it is possible to minimize (or reduce) or prevent external moisture or oxygen from permeating into the organic cover layer 148 and the interfaces therewith.

The through-hole 190 is formed through a plurality of thin film layers disposed in the hole area HA and the surrounding area. For example, the through-hole 190 is formed through the inorganic dielectric layers 114, 116, and 102, the light-emitting stack 134, the cathode electrode 136, the blocking element 118, and the inorganic encapsulation layers 142 and 146, which are disposed in the hole area HA and the surrounding area, so as to expose the upper surface of the substrate 101 or the multi-layered buffer layer 112. Since the inorganic dielectric layers 114, 116, and 102, the light-emitting stack 134, and the inorganic encapsulation layers 142 and 146, which are disposed in the hole area HA, are removed by the through-hole 190, a laser trimming process of forming the substrate hole 120 is simplified.

Since the hole area HA is disposed in the active area AA, the hole area HA may be surrounded by a plurality of subpixels SP, each of which includes a light-emitting element 130. At least one substrate hole 120, disposed in the hole area HA, is illustrated as having a circular shape. Alternatively, the substrate hole 120 may be formed so as to have a polygonal or oval shape. The substrate hole 120 is formed through the multi-layered buffer layer 112 and the substrate 101. The substrate hole 120 overlaps the through-hole 190, and has a smaller line width than the through-hole 190.

Figure 4:
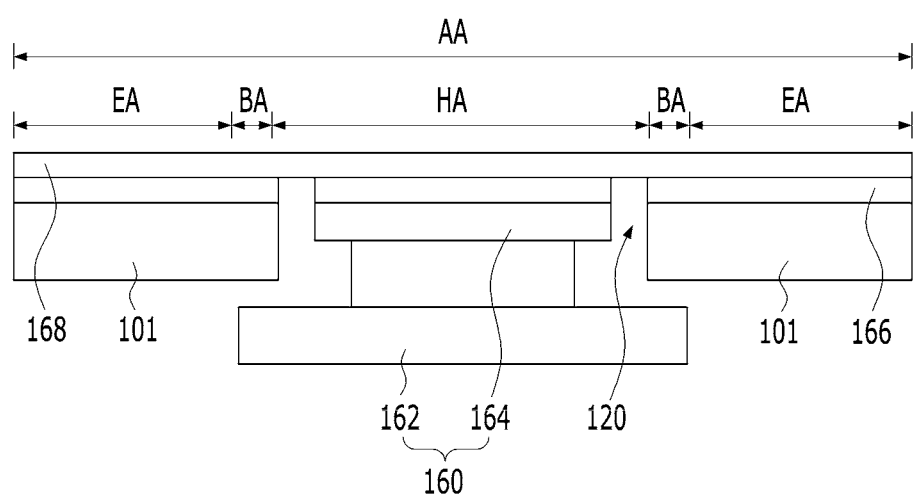
FIG. 4 is a sectional view showing a camera module that is inserted into the substrate hole shown in FIG. 2.

An electronic part, including a camera, a speaker, a flash light source, or a biometric sensor such as a fingerprint sensor, is disposed in the hole area HA. In the present disclosure, a structure in which a camera module 160 is disposed in the hole area HA, as shown in FIG. 4, will be described by way of example.

The camera module 160 includes a camera lens 164 and a camera-driving unit 162.

The camera-driving unit 162 is disposed at the rear surface of the substrate 101 of the display device, and is connected to the camera lens 164.

The camera lens 164 is disposed in the substrate hole 120, which extends from the thin film layer disposed at the lowermost part of the active area AA (e.g., the substrate 101 or a back plate) to the thin film layer disposed at the uppermost part of the active area AA (e.g., a polarizing plate 166). Consequently, the camera lens 164 is disposed so as to face a cover glass 168. Here, the substrate hole 120 has a smaller line width than the through-hole 190, and is disposed so as to overlap the through-hole 190. The substrate hole 120 is formed through the substrate 101, the inorganic cover layer 170, and the polarizing plate 166, or is formed through the substrate 101 and the polarizing plate 166.

In the case in which the camera module 160 is disposed in the active area AA, a non-display area, i.e., a bezel area, of the display device may be reduced or minimized.

FIGS. 5A to 5E are sectional views illustrating a method of manufacturing the organic light-emitting display device having the substrate hole shown in FIG. 2.

Figure 5A:
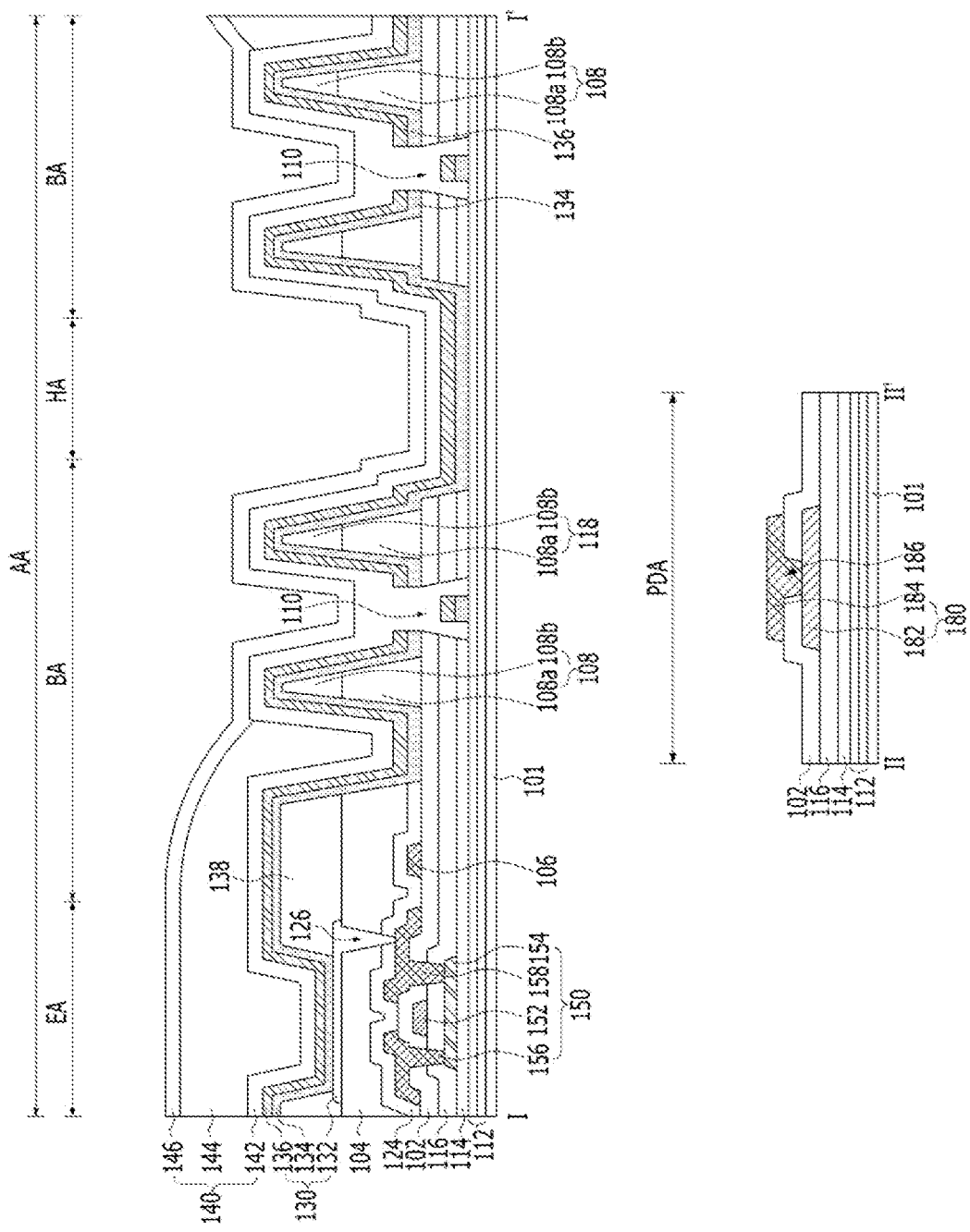
FIGS. 5A to 5E are sectional views illustrating a method of manufacturing the organic light-emitting display device having the substrate hole shown in FIG. 2.

Specifically, as shown in FIG. 5A, a multi-layered buffer layer 112 and an active buffer layer 114 are formed on a substrate 101. Here, the substrate 101 is made of a plastic material that exhibits high flexibility, by which the substrate 101 is bendable. For example, the substrate 101 may be made of polyimide (PI), polyethylene terephthalate (PET), polyethylene naphthalate (PEN), polycarbonate (PC), polyether sulfone (PES), polyacrylate (PAR), polysulfone (PSF), or cyclic olefin copolymer (COC).

Subsequently, an active layer 154 is formed on the active buffer layer 114 through a photolithography and etching process, and then a gate dielectric film 116, made of an inorganic dielectric material, is formed on the active layer 154. A gate electrode 152 and a pad lower electrode 182 are formed on the gate dielectric film 116 through a photolithography and etching process, and then an interlayer dielectric film 102, made of an inorganic dielectric material, is formed. The interlayer dielectric film 102 and the gate dielectric film 116 are patterned through a photolithography and etching process to form source and drain contact holes (not shown), through which the active layer 154 is exposed, and a first pad contact hole 186, through which the pad lower electrode is exposed. At the same time, the active buffer layer 114, the interlayer dielectric film 102, and the gate dielectric film 116 in the hole area HA are removed. Subsequently, the interlayer dielectric film 102, the gate dielectric film 116, and the active buffer layer 114 are patterned through a photolithography and etching process to form a blocking recess 110, by which the upper surface of the multi-layered buffer layer 112 is exposed. At this time, a portion of the multi-layered buffer layer 112 may be patterned through an etching process, whereby the side surface of the multi-layered buffer layer 112 may be exposed by the blocking recess 110.

Subsequently, a pad upper electrode 184 and source and drain electrodes 156 and 158 are formed on the interlayer dielectric film 102 through a photolithography and etching process. Subsequently, a planarization layer 104, and an anode electrode 132 are sequentially formed through a photolithography and etching process. Subsequently, a bank 138, an inner dam 108, a blocking element 118, and an outer dam 128 are simultaneously formed through a photolithography and etching process using the same mask.

A light-emitting stack 134 and a cathode electrode 136 are sequentially formed on the substrate 101, on which the bank 138 is formed, through a deposition process using a shadow mask. At this time, the light-emitting stack 134 and the cathode electrode 136 are disconnected by the blocking recess 110. Subsequently, at least one inorganic encapsulation layer 142 and 146 and at least one organic encapsulation layer 144 are stacked on the cathode electrode 136 to form an encapsulation unit 140. At this time, the organic encapsulation layer 144 is formed in the other areas, excluding the hole area HA and a pad area PDA, between the inner dam 108 and the outer dam 128.

Figure 5B:
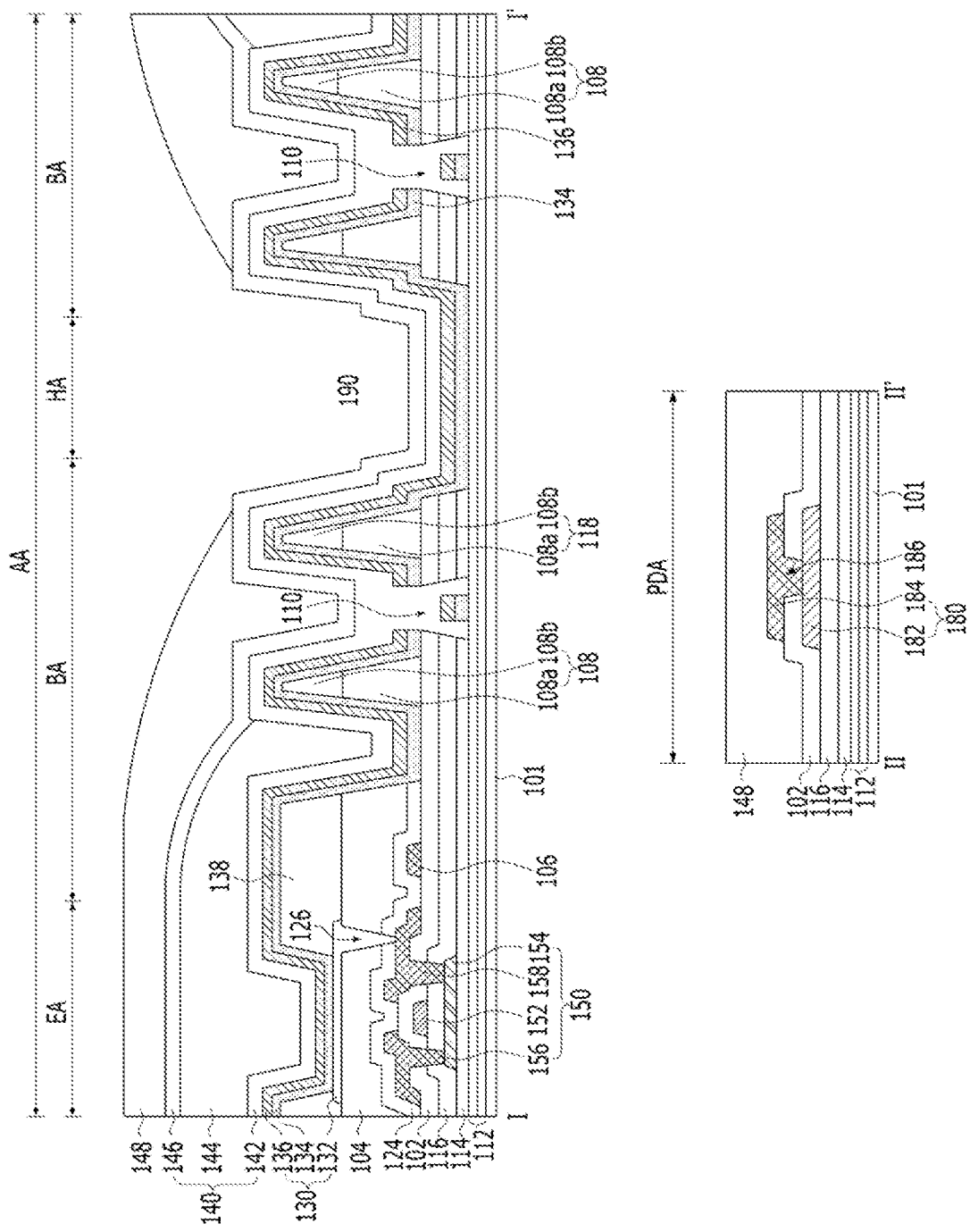
Figure 5C:
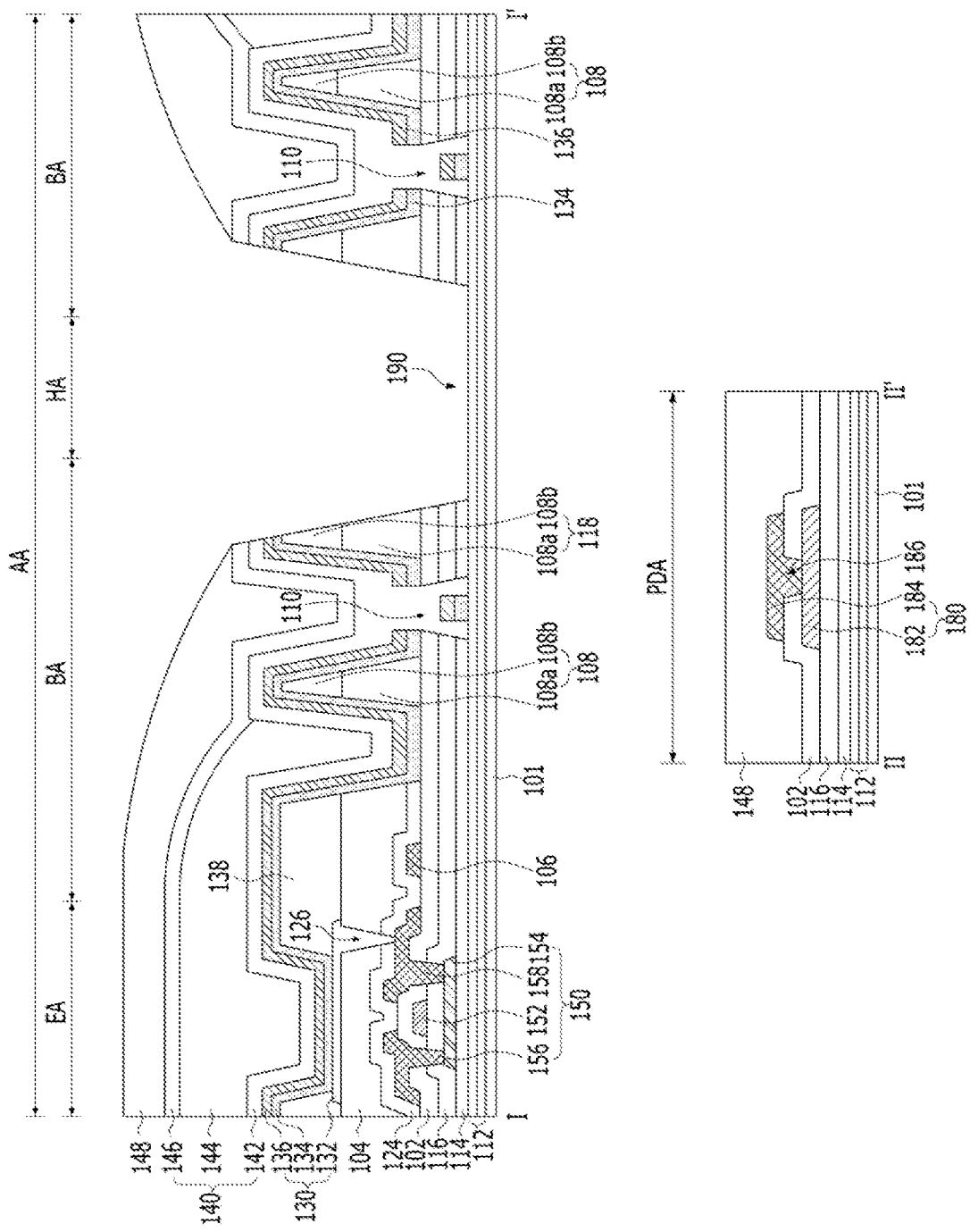

The same organic dielectric material as the organic encapsulation layer 144 is applied to the substrate 101, on which the encapsulation unit 140 is formed, to form an organic cover layer 148, as shown in FIG. 5B. At this time, the organic cover layer 148 is formed in the other regions, excluding the hole area HA, by the blocking element 118. Subsequently, the inorganic encapsulation layer 142 and 146, the cathode electrode 136, the interlayer dielectric film 102, the gate dielectric film 116, and the active buffer layer 114 are etched through an etching process using the organic cover layer 148 as a mask to form a through-hole 190, as shown in FIG. 5C. Meanwhile, a portion of the blocking element 118 may be etched when the through-hole is formed.

Figure 5D:
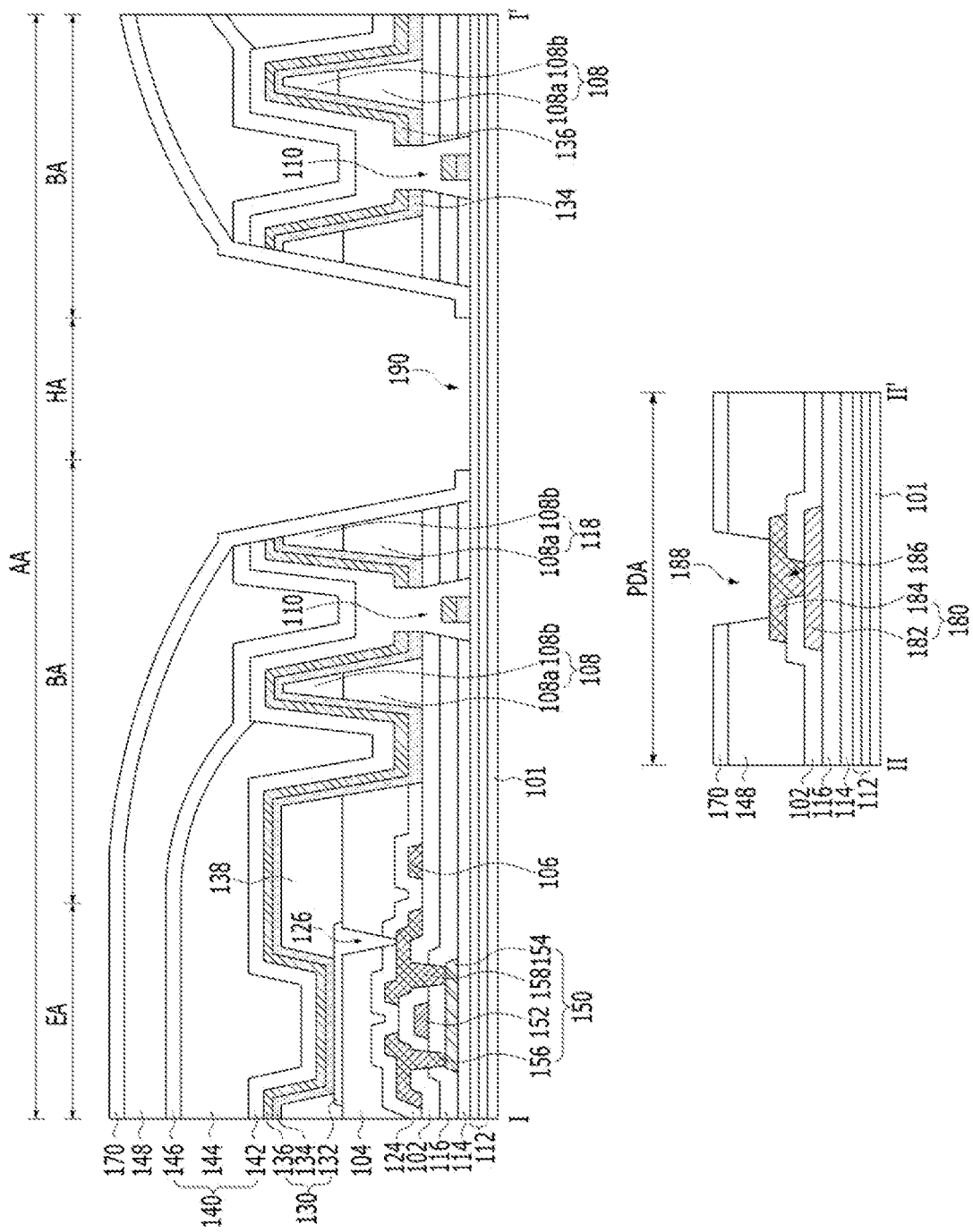

Subsequently, an inorganic dielectric material is deposited on the entire surface of the substrate 101, in which the through-hole 190 is formed, to form an inorganic cover layer 170. The inorganic cover layer 170 and the organic cover layer 148 are patterned through a photolithography and etching process, whereby a second pad contact hole 188 is formed and the inorganic cover layer 170 in the hole area HA is removed, as shown in FIG. 5D.

Figure 5E:
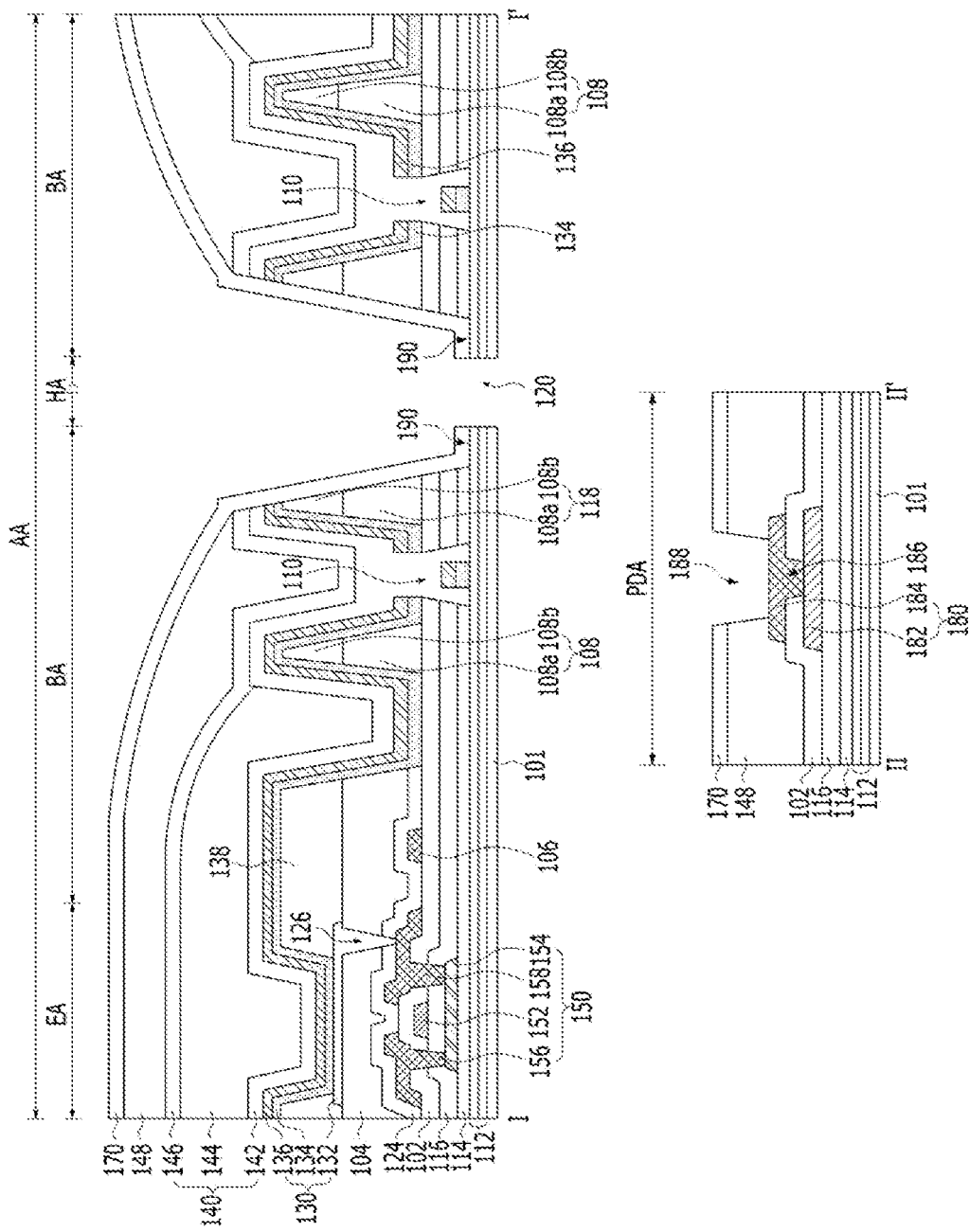

Subsequently, the multi-layered buffer layer 112 and the substrate 101 are patterned through a laser trimming process to form a substrate hole 120, as shown in FIG. 5E.

In the present disclosure, as described above, the organic cover layer 148, which is used as a mask when the through-hole 190 is formed, is formed merely through an application process alone. In the present disclosure, therefore, a photolithography process and a stripping process are not required when the organic cover layer 148 and the through-hole 190 are formed. Consequently, it is possible to prevent damage to the light-emitting stack 134 due to a stripping solution used during the stripping process.

Also, in the present disclosure, the organic cover layer 148 is formed through an application process after the encapsulation unit 140 is formed, and at least one masking process can be used to form the inorganic cover layer 170, which is not formed in the hole area HA, whereby a masking process may be simplified.

Furthermore, the thin film layers disposed in the hole area HA are removed through a dry etching process to form the through-hole 190, and then the substrate 101 is removed through a laser trimming process to form the substrate hole 120. Consequently, it is possible to reduce or minimize the number of thin films to be removed through the laser trimming process, whereby it is possible to reduce or minimize the occurrence of physical impacts during the laser trimming process.

Figure 6:
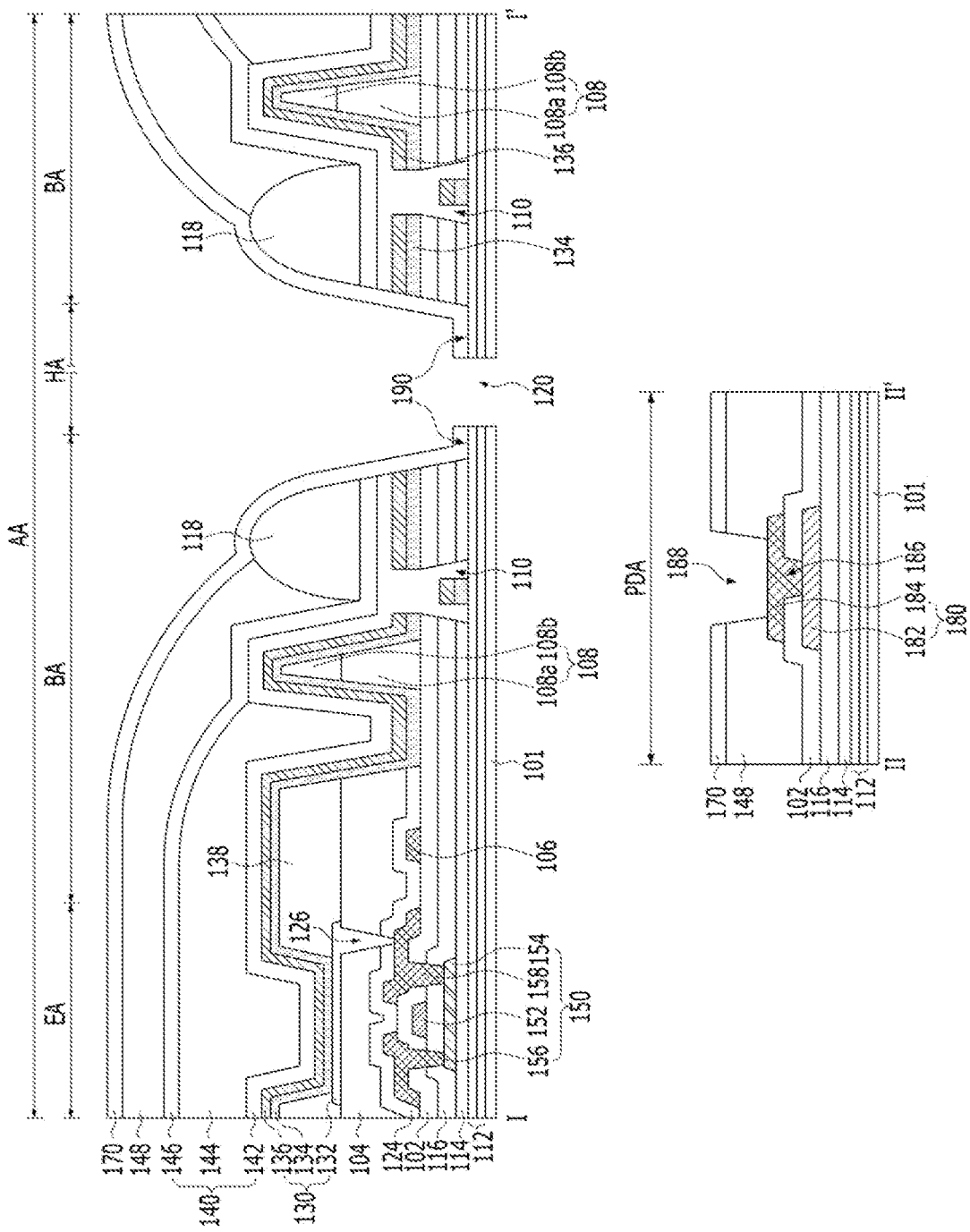
FIG. 6 is a view showing an organic light-emitting display device having a substrate hole according to one or more embodiments of the present disclosure.

FIG. 6 is a view showing an organic light-emitting display device according to one or more embodiments of the present disclosure.

The organic light-emitting display device shown in FIG. 6 is identical in construction to the organic light-emitting display device shown in FIG. 2 except that the blocking element 118 is located higher than the inner dam 108. Therefore, a detailed description of corresponding components of the organic light-emitting display device will be omitted.

The blocking element 118 is disposed on the second inorganic encapsulation layer 146, which is disposed at the uppermost part of the encapsulation unit 140. Since the blocking element 118 is located higher than the inner dam 108, the blocking element 118 is formed so as to have a smaller thickness than the inner dam 108. Consequently, the uppermost surface of the blocking element 118 is located at the same height as the uppermost surface of the inner dam 108, or is located higher than uppermost surface of the inner dam 108.

The blocking element 118 is made of an organic dielectric material, for example, the same organic dielectric material as at least one of the bank 138, the planarization layer 104, or the inner dam 108. Since the blocking element 118 is disposed on the second inorganic encapsulation layer 146 so as to overlap the blocking recess 110, an undercut area formed by the blocking recess 110 is protected.

Since the blocking element 118 is disposed so as to completely surround the substrate hole 120, it is possible to prevent the organic cover layer 148, which may be used as a moisture permeation path, from spreading to the substrate hole 120.

The organic cover layer 148 is formed on the uppermost inorganic encapsulation layer 146 of the encapsulation unit 140, and is made of the same material as the organic encapsulation layer 144. Consequently, the organic cover layer 148 is formed only through an application process without a separate photomasking process, whereby no separate stripping process is required.

Since the organic cover layer 148 does not contact the light-emitting stack 134, it is possible to prevent moisture from permeating into the light-emitting stack 134 through the organic cover layer 148. In addition, since the organic cover layer 148 is disposed on the encapsulation unit 140, it is possible to prevent the inorganic encapsulation layers 142 and 146, which are disposed in the emission area EA, from being etched when the through-hole 190 is formed.

FIGS. 7A to 7E are sectional views illustrating a method of manufacturing the organic light-emitting display device having the substrate hole shown in FIG. 6.

Figure 7A:
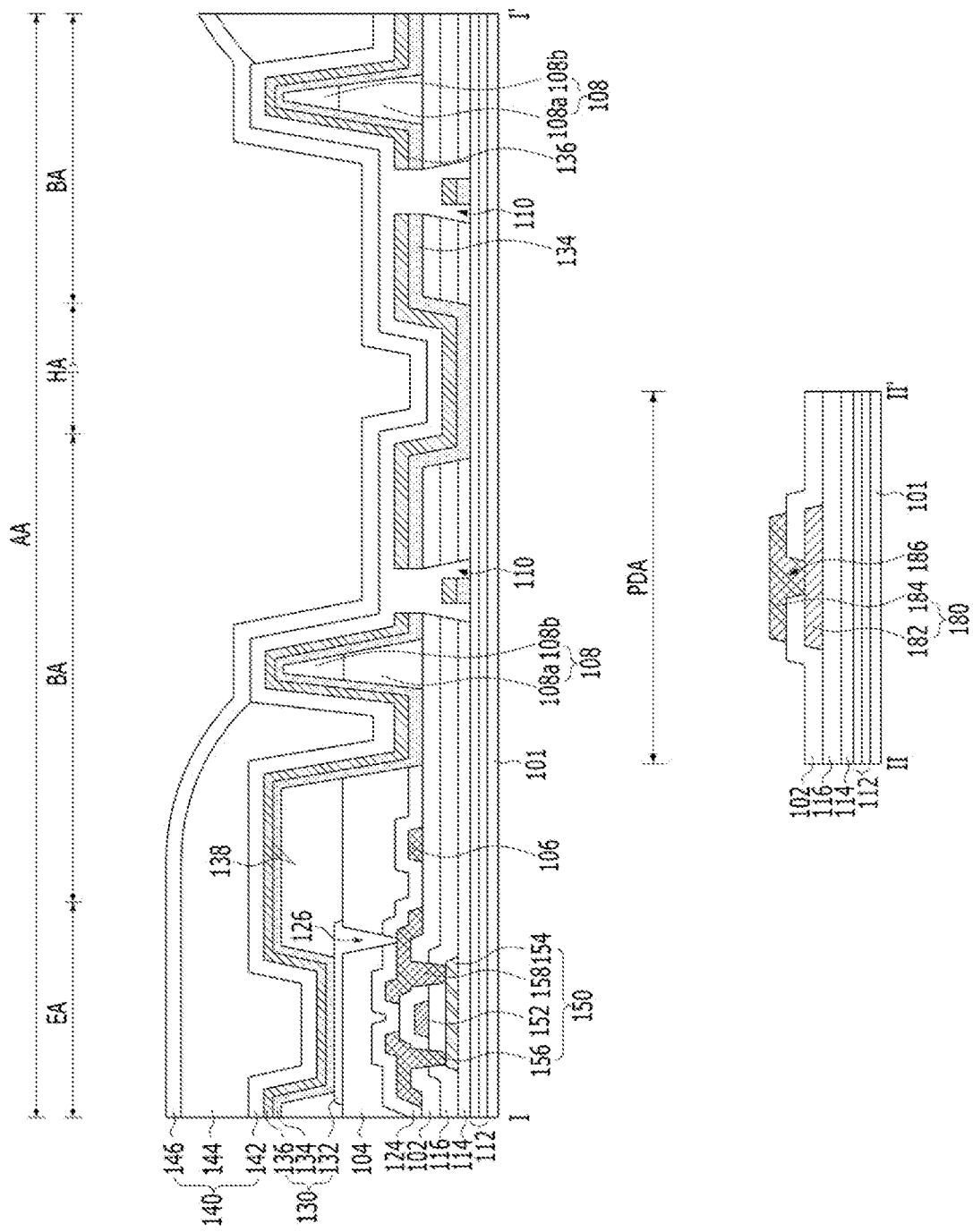
FIGS. 7A to 7E are sectional views illustrating a method of manufacturing the organic light-emitting display device having the substrate hole shown in FIG. 6.

Specifically, as shown in FIG. 7A, a thin-film transistor (driving transistor) 150, pads 180, and a blocking recess 110 are formed on a substrate 101. Subsequently, a passivation film 124, a planarization layer 104, and an anode electrode 132 are sequentially formed through a photolithography and etching process. Subsequently, a bank 138, an inner dam 108, and an outer dam 128 are simultaneously formed through a photolithography and etching process using the same mask.

A light-emitting stack 134 and a cathode electrode 136 of the light-emitting element 130 are sequentially formed on the substrate 101, on which the bank 138, the inner dam 108, and the outer dam 128 are formed. Subsequently, at least one inorganic encapsulation layer 142 and 146 and at least one organic encapsulation layer 144 are stacked on the cathode electrode 136 to form an encapsulation unit 140.

Figure 7B:
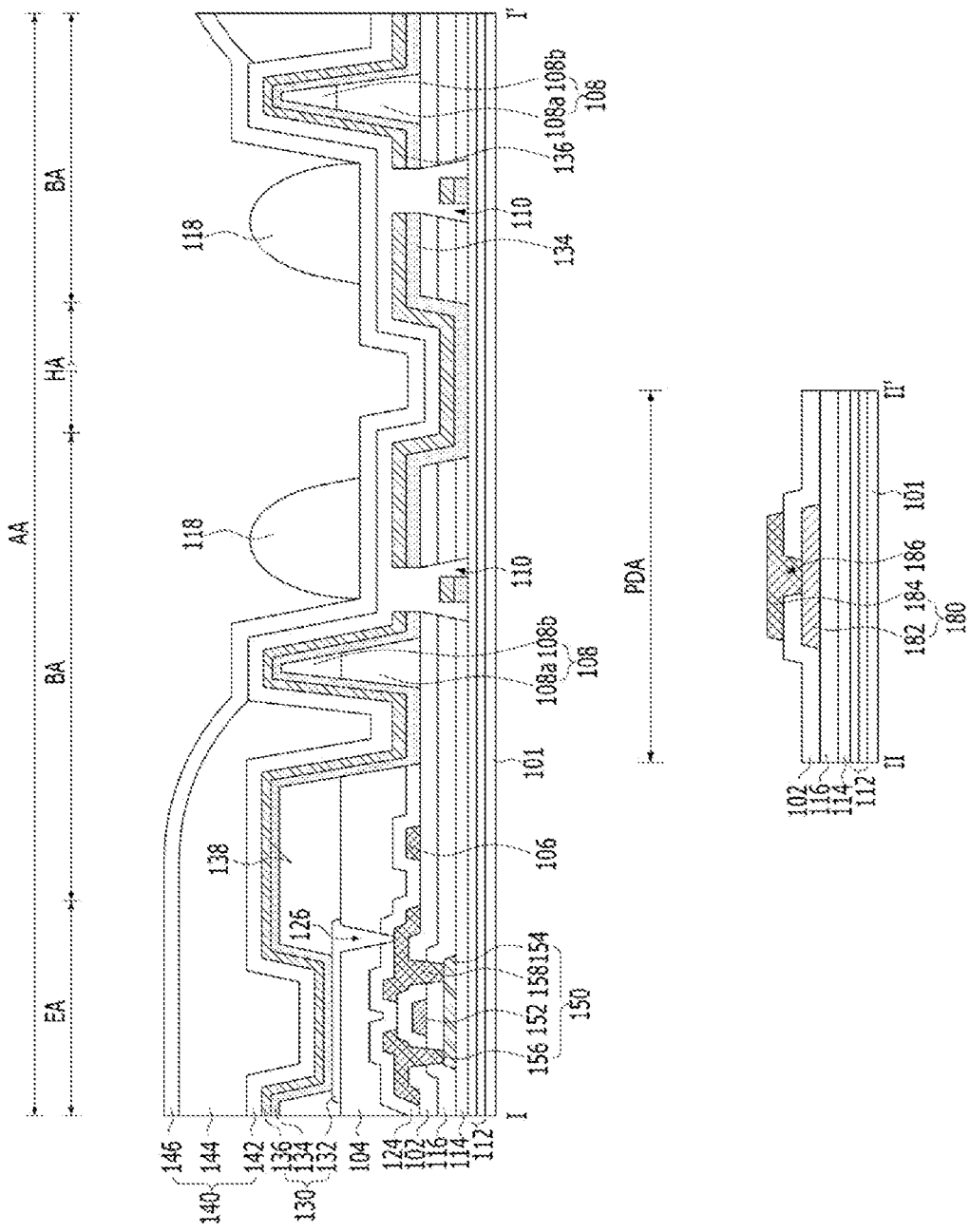
Figure 7C:
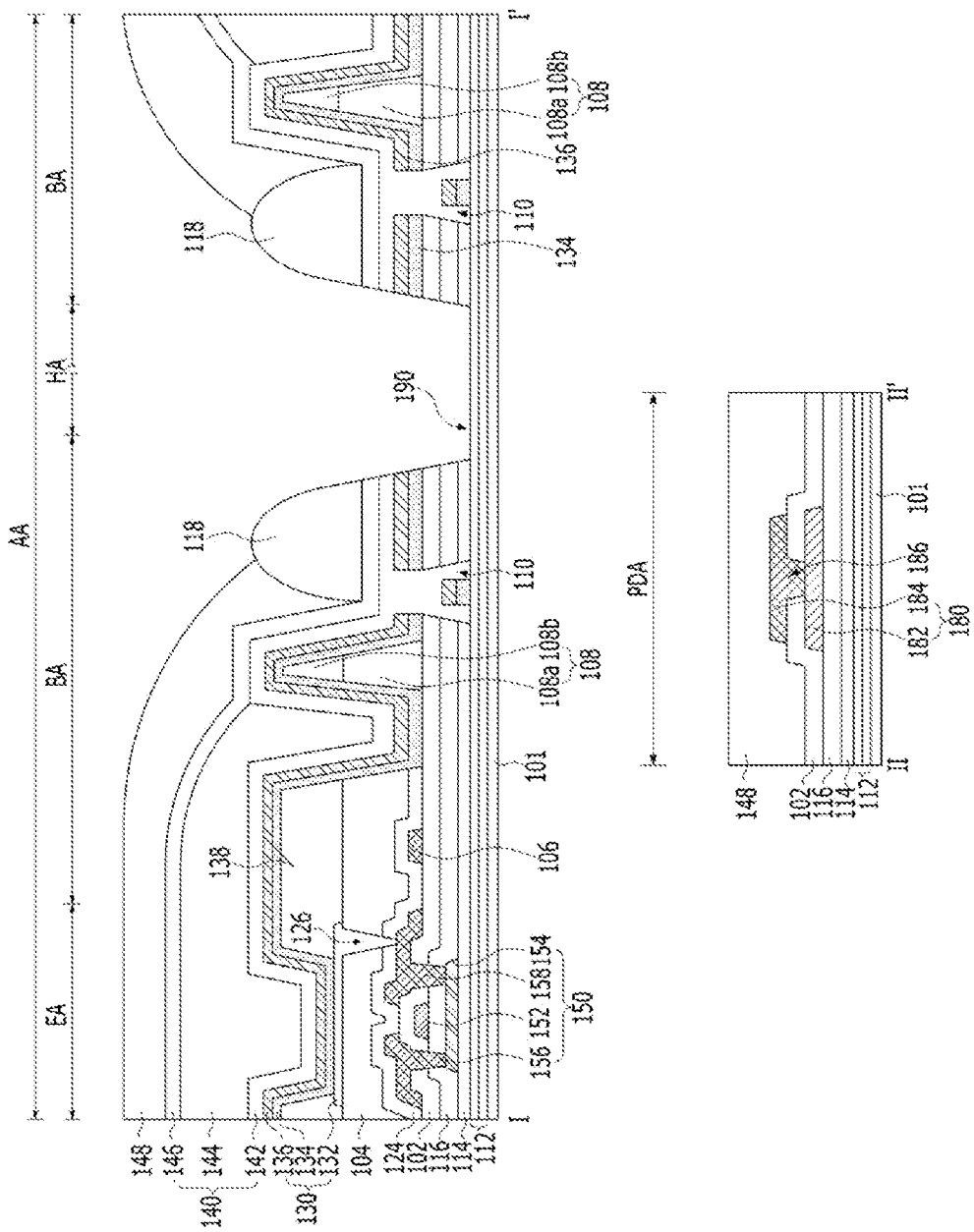

A photosensitive organic dielectric material is applied to the substrate 101, on which the encapsulation unit 140 is formed, and is patterned through a photolithography process to form a blocking element 118, as shown in FIG. 7B. Subsequently, an organic dielectric material is applied to the substrate 101, on which the blocking element 118 is formed, to form an organic cover layer 148, as shown in FIG. 7C. At this time, the organic cover layer 148 is formed in the other areas, excluding a hole area HA, by the blocking element 118. Subsequently, the inorganic encapsulation layer 142 and 146, the cathode electrode 136, the light-emitting stack 134, the interlayer dielectric film 102, the gate dielectric film 116, and the active buffer layer 114 in the hole area HA are etched through an etching process using the organic cover layer 148 and the blocking element 118 as a mask to form a through-hole 190. Meanwhile, a portion of the blocking element 118 may be etched when the through-hole 190 is formed.

Figure 7D:
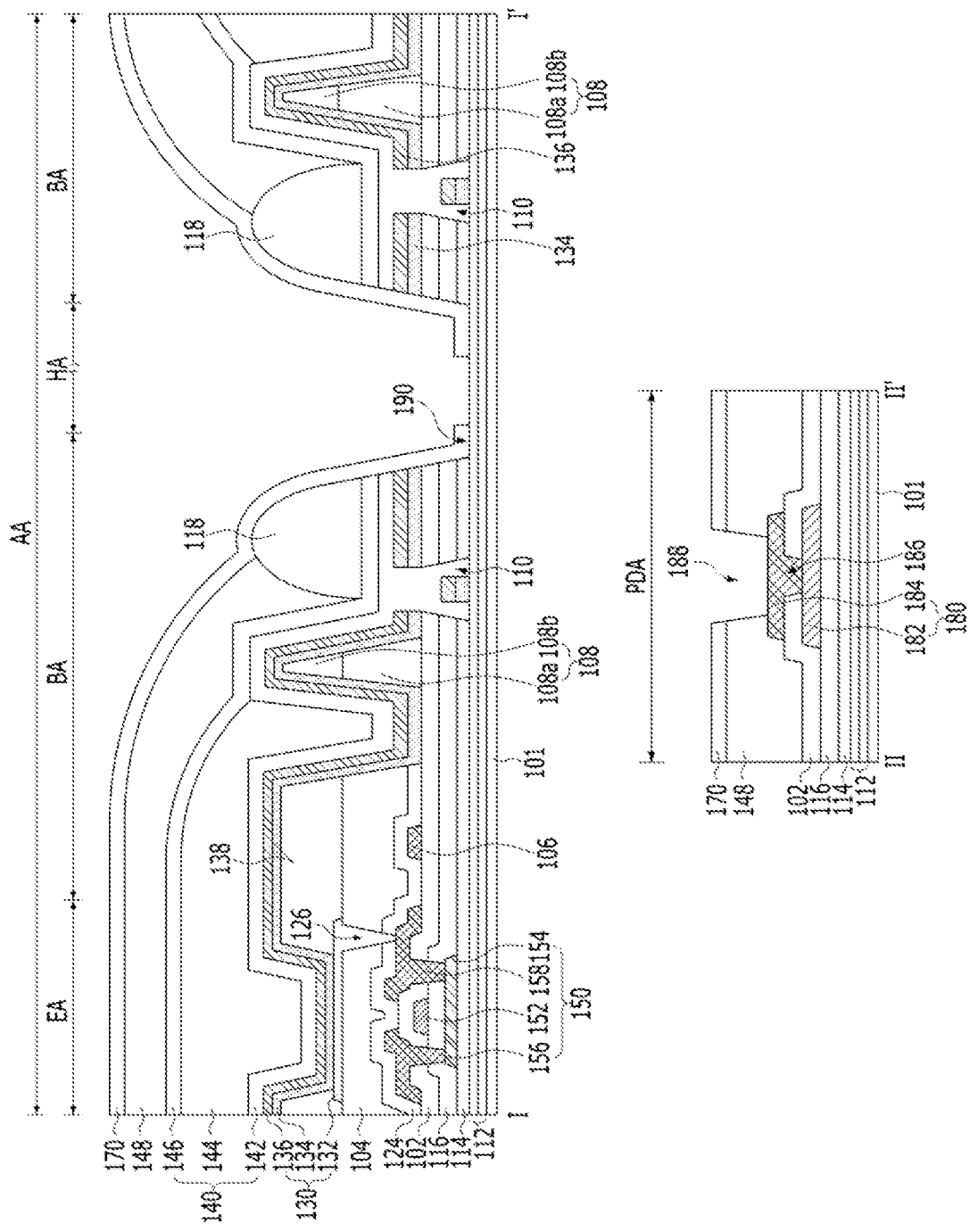

Subsequently, an inorganic dielectric material is deposited on the entire surface of the substrate 101, in which the through-hole 190 is formed, to form an inorganic cover layer 170. The inorganic cover layer 170 and the organic cover layer 148 are patterned through a photolithography and etching process, whereby a second pad contact hole 188 is formed and the inorganic cover layer 170 in the hole area HA is removed, as shown in FIG. 7D.

Figure 7E:
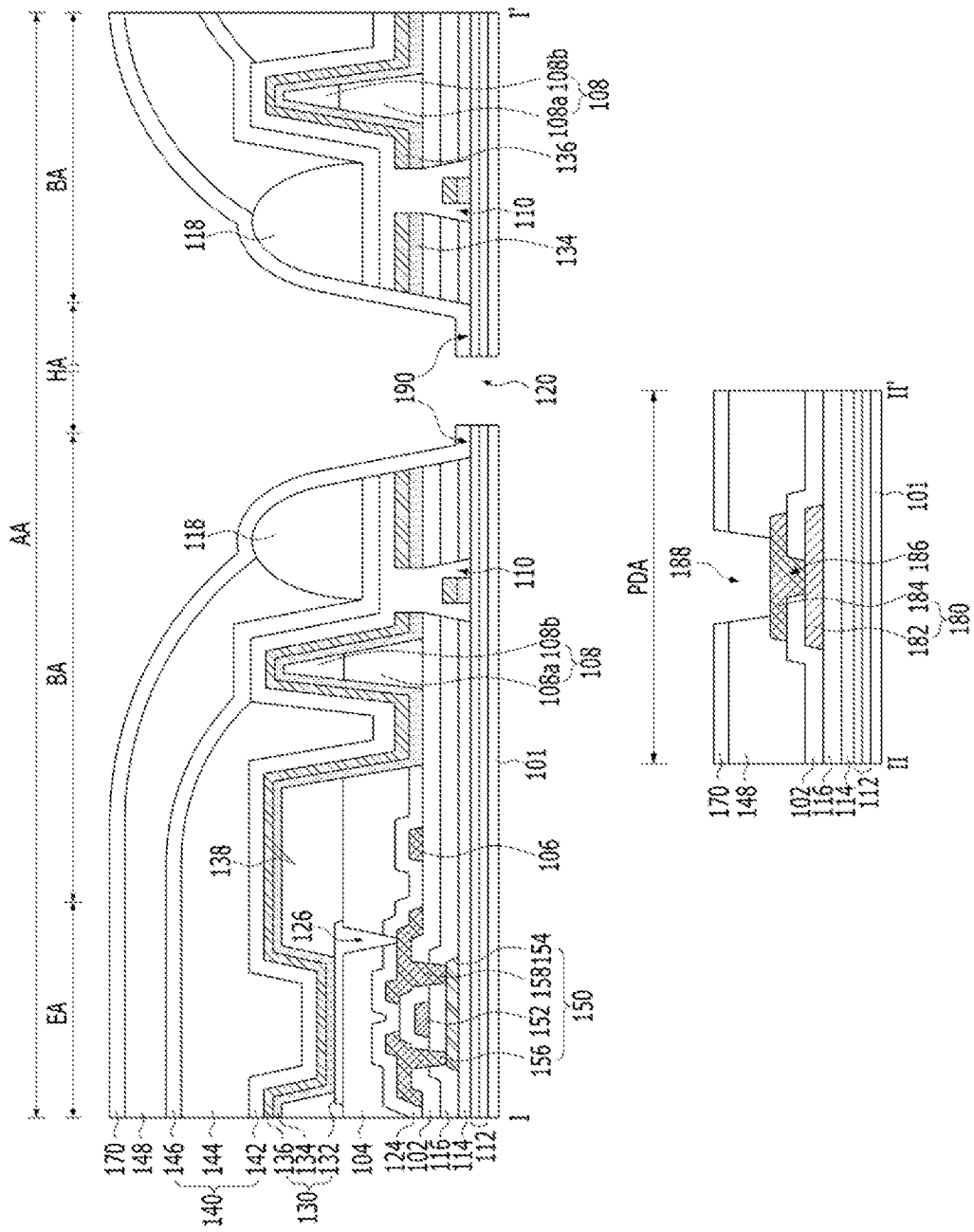

Subsequently, the multi-layered buffer layer 112 and the substrate 101 are patterned through a laser trimming process to form a substrate hole 120, as shown in FIG. 7E.

In the present disclosure, as described above, the organic cover layer 148, which is used as a mask when the through-hole is formed, is formed only through an application process. In the present disclosure, therefore, a photolithography process and a stripping process are not required when the organic cover layer 148 is formed. Consequently, it is possible to prevent damage to the light-emitting stack 134 due to the stripping solution that is used during the stripping process.

Also, in the present disclosure, the organic cover layer 148 is formed through an application process after the encapsulation unit 140 is formed, and at least one masking process can be used to form the inorganic cover layer 170, which is not formed in the hole area HA, whereby a masking process may be simplified.

Furthermore, the thin film layers disposed in the hole area HA are removed through a dry etching process to form the through-hole 190, and then the substrate 101 is removed through a laser trimming process to form the substrate hole 120. Consequently, it is possible to reduce or minimize the number of thin films to be removed through the laser trimming process, whereby it is possible to reduce or minimize the occurrence of physical impacts during the laser trimming process.

Meanwhile, a touch electrode and a touch buffer film included in a touch sensor may be disposed between the encapsulation unit 140 and the organic cover layer 148. The touch electrode may be disposed on the touch buffer film in contact with the encapsulation unit 140, as shown in FIG. 7E. Alternatively, the touch electrode may be disposed between the encapsulation unit 140 and the organic cover layer 148 without the touch buffer film. The touch electrode may be disposed on the encapsulation unit 140 without the touch buffer film. In this case, the touch buffer film and the touch electrode are sequentially formed on the encapsulation unit 140 formed by the manufacturing method shown in FIGS. 7A and 7B, and then the organic cover layer 148 and the inorganic cover layer 170 are sequentially formed by the manufacturing method shown in FIGS. 7C to 7E, thereby completing the organic light emitting display device having the touch sensor.

In addition, at least one of a touch dielectric film and the touch buffer film included in the mutual capacitance touch sensor having the first and second touch electrodes may be formed to extend to at least one of the inner dam 108, the blocking element 118, the outer dam 128, and the pad area PDA.

Furthermore, the inorganic cover layer and the organic cover layer according to the present disclosure may be used as the touch dielectric film and the touch buffer film included in the touch sensor disposed on the encapsulation unit.

As is apparent from the above description, in the present disclosure, the through-hole, into which the camera module is inserted, is disposed in the active area, whereby it is possible to reduce or minimize the non-display area, i.e., the bezel area, of the display device.

Also, in the present disclosure, the organic cover layer, which is used as a mask when the through-hole is formed, is formed only through an application process, whereby a photolithography process and a stripping process are not required when the organic cover layer and the through-hole are formed. Consequently, it is possible to prevent damage to the light-emitting stack due to the stripping solution that is used during the stripping process.

Furthermore, the thin film layers disposed in the hole area are removed through a dry etching process to form a through-hole, and then the substrate is removed through a laser trimming process to form a substrate hole. Consequently, it is possible to reduce or minimize the number of thin films to be removed through the laser trimming process, whereby it is possible to reduce or minimize the occurrence of physical impacts during the laser trimming process.

It will be apparent to those skilled in the art that various modifications and variations can be made in the present disclosure without departing from the spirit or scope of the disclosure.

The various embodiments described above can be combined to provide further embodiments. Further changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A display device, comprising:
   a substrate having a substrate hole formed through the substrate in an active area of the display device;
   a plurality of light-emitting elements disposed on the substrate in the active area;
   an encapsulation unit disposed on the light-emitting elements;
   an organic cover layer disposed on the encapsulation unit;

an inner dam disposed between the substrate hole and the light-emitting elements;

a blocking element at least partly disposed between the organic cover layer and the substrate; and a blocking recess disposed between the substrate hole and the inner dam, wherein the blocking element is disposed to laterally surround the substrate hole.

2. The display device according to claim 1, wherein the blocking element is made of a same material as the inner dam, and the blocking element and the inner dam are disposed on a same plane.

3. The display device according to claim 1, wherein the blocking recess is formed in a reverse tapered shape.

4. The display device according to claim 1, wherein the blocking element is made of a different material than the inner dam.

5. The display device according to claim 1, further comprising a touch electrode disposed between the encapsulation unit and the organic cover layer.

6. The display device according to claim 1, wherein the encapsulation unit includes a first inorganic encapsulation layer, a second inorganic encapsulation layer, and an organic encapsulation layer disposed between the first inorganic encapsulation layer and the second inorganic encapsulation layer, and the first inorganic encapsulation layer and the second inorganic encapsulation layer overlap the blocking recess.

7. The display device according to claim 1, wherein the blocking recess is disposed between the inner dam and the blocking element.

8. The display device according to claim 1, further comprising:

a driving transistor connected to a first light-emitting element of the light-emitting elements;

a planarization layer disposed on the driving transistor; and a bank for exposing an anode electrode of the first light-emitting element, wherein each of the inner dam and the blocking element includes:

a lower layer made of a same material as the planarization layer; and an upper layer made of a same material as the bank.

9. The display device according to claim 1, wherein the blocking element is disposed in a first plane different from a second plane on which the inner dam is disposed.

10. The display device according to claim 9, wherein the blocking element is disposed on at least a first portion of the encapsulation unit; and the inner dam is disposed under at least a second portion of the encapsulation unit.

11. The display device according to claim 9, wherein the blocking recess overlaps the blocking element.

12. The display device according to claim 1, further comprising a through-hole formed through a plurality of thin film layers disposed between the substrate and the organic cover layer.

13. The display device according to claim 12, further comprising an inorganic cover layer disposed on side surfaces of the thin film layers exposed through the through-hole and on the organic cover layer.

14. The display device according to claim 13, further comprising:

a pad area;

a pad disposed on the substrate in the pad area; and a pad contact hole formed through the organic cover layer that is disposed on the pad, wherein the pad contact hole exposes the pad.

15. The display device according to claim 14, wherein the pad contact hole is formed through the inorganic cover layer.

16. The display device according to claim 6, wherein the organic cover layer is made of a same material as the organic encapsulation layer.

17. The display device according to claim 1, further comprising an electronic part disposed in the substrate hole.

18. The display device according to claim 17, wherein the electronic part includes at least one of a camera, a speaker, a flash light source, or a biometric sensor.

19. The display device according to claim 1, wherein the blocking element is at least partly disposed between the substrate hole and the inner dam.

20. The display device according to claim 13, further comprising:

a pad area;

a plurality of pads disposed on the substrate in the pad area; and a plurality of pad contact holes in the organic cover layer that is disposed on the pads, wherein each of the pads is exposed by at least one of the pad contact holes.

* * * * *